(12) United States Patent
Wang et al.

(10) Patent No.: US 7,193,244 B2
(45) Date of Patent: Mar. 20, 2007

(54) ELECTRONIC DEVICES WITH EDGE CONNECTORS AND METHODS OF USING THE SAME

(75) Inventors: Jian Wang, Goleta, CA (US); Matthew Stevenson, Santa Maria, CA (US); Gang Yu, Santa Barbara, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 133 days.

(21) Appl. No.: 11/101,700

(22) Filed: Apr. 8, 2005

(65) Prior Publication Data

US 2006/0055008 A1 Mar. 16, 2006

Related U.S. Application Data

(60) Provisional application No. 60/562,113, filed on Apr. 14, 2004.

(51) Int. Cl.
*H01L 33/00* (2006.01)
(52) U.S. Cl. .......................................... 257/88; 438/34
(58) Field of Classification Search ............... 438/22, 438/28, 34, 35, 99, 956; 257/40, 88, E39.007, 257/E51.001, E51.003, E51.012, E51.018, 257/E51.022, E51.026
See application file for complete search history.

(56) References Cited

U.S. PATENT DOCUMENTS 6,538,374 B2 3/2003 Hosokawa
6,608,449 B2 8/2003 Fukunaga
6,867,541 B2 3/2005 Okuyama et al.
7,075,112 B2* 7/2006 Roberts et al. ............... 257/79
2002/0158835 A1 10/2002 Kobayashi et al.
2004/0115474 A1 6/2004 Albrecht et al.
2004/0125055 A1 7/2004 Sung
2005/0077601 A1 4/2005 Yu et al.

* cited by examiner

*Primary Examiner*—David Vu
(74) *Attorney, Agent, or Firm*—John H. Lamming

(57) ABSTRACT

An electronic device includes a substrate having a primary surface, an array lying along the primary surface, wherein the array includes one or more radiation-emitting components, one or more radiation-responsive components, or any combination thereof, and a first edge connector. In a direction parallel to the primary surface, the first edge connector lies between the array and a perimeter of the substrate. In one embodiment, the electronic device is designed, such that during normal operation, the first edge connector has a temperature difference, due to current flow through the first edge connector, of no more than 10° C. In another embodiment, the array has an emission homogeneity of at least 75% over a lifetime of the electronic device. The electronic device can be operated with good emission intensity and have an extended electronic device lifetime compared to an electronic device having edge connectors that can cause local heating.

23 Claims, 8 Drawing Sheets

ELECTRONIC DEVICES WITH EDGE CONNECTORS AND METHODS OF USING THE SAME

This application claims priority to Provisional Application No. 60/562,113 filed Apr. 14, 2004.

BACKGROUND OF THE INVENTION

1. Field of the Invention

The invention relates in general to electronic devices and processes, and more particularly to electronic devices with edge connectors outside arrays and methods of using the same.

2. Description of the Related Art

Displays typically include electronic devices that form pixel elements and circuits used with those pixel elements. Examples of electronic devices include Organic Light-Emitting Diodes (OLEDs), which include Polymer Light-Emitting Diodes (PLEDs) and Small Molecule Organic Light-Emitting Diodes (SMOLEDs). High information content is desired not only for small size displays used for web-phones and personal digital assistants, but also for large size displays in the applications of desktops, laptops, wall-mounted displays, computer monitors and high definition televisions. For OLEDs to be used for high information content (e.g., more than 320×240×RGB), large size (e.g., >5") information displays, an active-matrix (AM) driving scheme is typically adopted.

Liquid Crystal Displays (LCDs) or inorganic LED displays, are voltage driven and typically operate at a relatively low current (approximately 20 to 300 mA for the entire display). Power supply connectors within LCD and LED displays typically have effective widths no greater than 1.5 mm. Unlike LCD or inorganic LED displays, OLED displays are current driven radiation-emitting devices that can include hundreds, thousands, or even millions of OLEDs and their corresponding control circuits and may use current of at least one ampere, and in may applications, substantially higher than one ampere.

High current density can cause two problems in displays: heat generation and voltage drops. The current generates heat. The unnecessary heat may put the whole system in an unstable operating condition, but can also shorten the lifetime of the display, decrease emission homogeneity of the display, or any combination thereof. The voltage drop along the power transmission line results in inefficient power delivery and wasted power. Higher information content OLED displays and higher emission intensity in OLED displays cannot be achieved unless heat generation and voltage drops within power transmission lines are addressed.

SUMMARY OF THE INVENTION

An electronic device includes a substrate having a primary surface, an array lying along the primary surface, wherein the array includes one or more radiation-emitting components, one or more radiation-responsive components, or any combination thereof, and a first edge connector. In a direction parallel to the primary surface, the first edge connector lies between the array and a perimeter of the substrate.

In a first aspect, the first edge connector is connected to the array and designed to transmit a power signal into the array. The electronic device is designed, such that during normal operation, the first edge connector has a temperature difference, due to current flow through the first edge connector, of no more than 10° C. The temperature difference is a first temperature minus a second temperature. The first temperature is a temperature of the first edge connector when the first edge connector is at a substantially steady state temperature, and the second temperature is a substantially ambient temperature.

In a second aspect, an electronic device includes a substrate having a primary surface, an array lying along the primary surface, wherein the array includes one or more radiation-emitting components, one or more radiation-responsive components, or any combination thereof, and a first edge connector, wherein, in a direction parallel to the primary surface, the first edge connector lies between the array and a perimeter of the substrate. The first edge connector is connected to the array and designed to transmit a power signal into the array, and an emission homogeneity for the array is at least 75% over a lifetime of the electronic device.

In a third aspect, a method of using an electronic device includes providing the electronic device that includes a substrate having a primary surface, an array lying along the primary surface, wherein the array includes one or more radiation-emitting components, one or more radiation-responsive components, or any combination thereof, and a first edge connector, wherein, in a direction parallel to the primary surface, the first edge connector lies between the array and a perimeter of the substrate. The method also includes transmitting a power signal through the first edge connector to the array, and operating the electronic device, such that an emission homogeneity for the array is at least 75% during a lifetime of the electronic device.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

Figure 1:
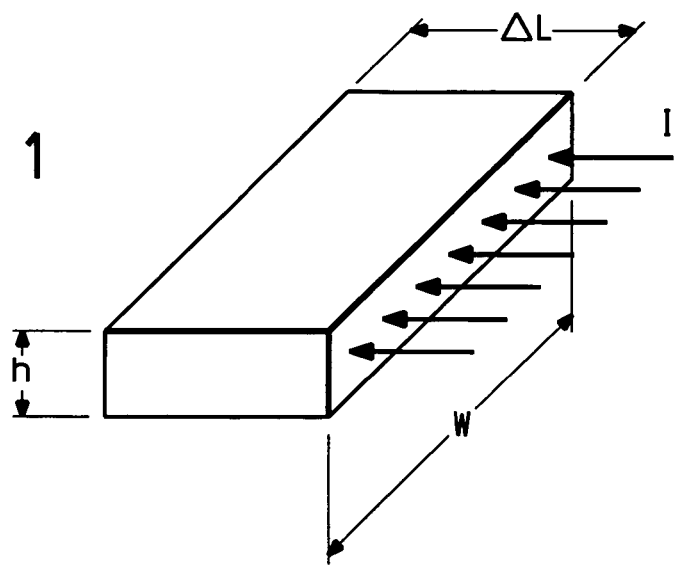
FIG. 1 includes an illustration of a perspective view of current flowing through a conductive member.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device includes a substrate having a primary surface, an array lying along the primary surface, wherein the array includes one or more radiation-emitting components, one or more radiation-responsive components, or any combination thereof, and a first edge connector. In a direction parallel to the primary surface, the first edge connector lies between the array and a perimeter of the substrate.

In a first aspect, the first edge connector is connected to the array and designed to transmit a power signal into the array. The electronic device is designed, such that during normal operation, the first edge connector has a temperature difference, due to current flow through the first edge connector, of no more than 10° C. The temperature difference is a first temperature minus a second temperature. The first temperature is a temperature of the first edge connector when the first edge connector is at a substantially steady state temperature, and the second temperature is a substantially ambient temperature.

In one embodiment of the first aspect, the array includes pixels, wherein each of the pixels includes a radiation-emitting component. In still another embodiment, each of the radiation-emitting components includes an organic active layer. In a particular embodiment, an emission homogeneity for the array is at least 75% over a lifetime of the electronic device. In a more particular embodiment, the lifetime of the electronic device is determined by measuring a first emission intensity of the array or a portion of the array at a first time, measuring a second emission intensity of the array or the portion of the array at a second time after the first time; and dividing the second emission intensity by the first emission intensity to obtain a quotient, wherein an end of the lifetime occurs when the quotient is less than 0.5. In another more particular embodiment, each of the radiation-emitting components is an OLED.

In a further embodiment of the first aspect, the electronic device further includes a second edge connector, wherein each of the first and second edge connectors lies immediately adjacent to the array. In still a further embodiment, the first edge connector lies immediately adjacent to the array and to a perimeter of the substrate.

In a second aspect, an electronic device includes a substrate having a primary surface, an array lying along the primary surface, wherein the array includes one or more radiation-emitting components, one or more radiation-responsive components, or any combination thereof, and a first edge connector, wherein, in a direction parallel to the primary surface, the first edge connector lies between the array and a perimeter of the substrate. The first edge connector is connected to the array and designed to transmit a power signal into the array, and an emission homogeneity for the array is at least 75% over a lifetime of the electronic device.

In one embodiment of the second aspect, the array includes pixels, wherein each of the pixels includes a radiation-emitting component. In another embodiment, each of the radiation-emitting components includes an organic active layer. In a particular embodiment, each of the radiation-emitting components is an OLED.

In still another embodiment of the second aspect, the electronic device is designed, such that during normal operation, the first edge connector has a temperature difference, due to current flow through the first edge connector, of no more than 10° C. The temperature difference is a first temperature minus a second temperature. The first temperature is a temperature of the first edge connector when the first edge connector is at a substantially steady state temperature, and the second temperature is a substantially ambient temperature.

In a further embodiment of the second aspect, the electronic device further includes a second edge connector, wherein each of the first and second edge connectors lies immediately adjacent to the array. In still a further embodiment, the first edge connector lies immediately adjacent to the array and to a perimeter of the substrate. In yet a further embodiment, the lifetime of the electronic device is determined by measuring a first emission intensity of the array or a portion of the array at a first time, measuring a second emission intensity of the array or the portion of the array at a second time after the first time, and dividing the second emission intensity by the first emission intensity to obtain a quotient, wherein an end of the lifetime occurs when the quotient is less than 0.5.

In a third aspect, a method of using an electronic device includes providing the electronic device that includes a substrate having a primary surface, an array lying along the primary surface, wherein the array includes one or more radiation-emitting components, one or more radiation-responsive components, or any combination thereof, and a first edge connector, wherein, in a direction parallel to the primary surface, the first edge connector lies between the array and a perimeter of the substrate. The method also includes transmitting a power signal through the first edge connector to the array, and operating the electronic device, such that an emission homogeneity for the array is at least 75% during a lifetime of the electronic device.

In one embodiment of the third aspect, the array includes pixels, wherein each of the pixels includes a radiation-emitting component. In another embodiment, each of the radiation-emitting components includes an organic active layer. In still another embodiment, operating the electronic device includes operating the electronic device until the first edge connector reaches a substantially steady state temperature, wherein the first edge connector experiences a temperature difference, due to current flow through the first edge connector, of no more than 10° C. The temperature difference is a first temperature minus a second temperature. The first temperature is a temperature of the first edge connector when the first edge connector is at a substantially steady state temperature, and the second temperature is a substantially ambient temperature.

In a further embodiment, the method further includes a second edge connector, wherein each of the first and second edge connectors lies immediately adjacent to the array. In still a further embodiment, the first edge connector lies immediately adjacent to the array and to a perimeter of the substrate. In yet a further embodiment, the lifetime of the electronic device is determined by measuring a first emission intensity of the array or a portion of the array at a first time, measuring a second emission intensity of the array or the portion of the array at a second time after the first time, and dividing the second emission intensity by the first emission intensity to obtain a quotient, wherein an end of the lifetime occurs when the quotient is less than 0.5.

Other features and advantages of the invention will be apparent from the following detailed description, and from the claims. The detailed description first addresses Definitions and Clarification of Terms followed by the Design Considerations, Examples, and finally Advantages.

1. Definitions and Clarification of Terms

Before addressing details of embodiments described below, some terms are defined or clarified.

The terms "array," "peripheral circuitry," and "remote circuitry" are intended to mean different areas or components of an electronic device. For example, an array may include pixels, cells, or other structures within an orderly arrangement (usually designated by columns and rows). The pixels, cells, or other structures within the array may be controlled locally by peripheral circuitry, which may lie on the same substrate as the array but outside the array itself. Remote circuitry typically lies away from the peripheral circuitry and can send signals to, or receive signals from, the array (typically via the peripheral circuitry). The remote circuitry may also perform functions unrelated to the array. The remote circuitry may or may not reside on the substrate having the array.

The term "connected," with respect to electronic components, circuits, or portions thereof, is intended to mean that two or more electronic components, circuits, or any combination of at least one electronic component and at least one circuit do not have any intervening electronic component lying between them. Parasitic resistance, parasitic capacitance, or both are not considered electronic components for the purposes of this definition. In one embodiment, electronic components are connected when they are electrically shorted to one another and lie at substantially the same voltage. Note that electronic components can be connected together using fiber optic lines to allow optical signals to be transmitted between such electronic components.

The term "edge connector" is intended to mean an electrical connector connected to one or more interconnects, wires, or conductors, or any combination thereof, wherein such edge connector extends into an array and lies at or near a perimeter of the array. In one embodiment, an edge connector can lie at or near a perimeter of a substrate. An edge connector can be a male or female edge connector. Also, a wire or other conductor lying outside the array may be soldered, bonded, or otherwise attached to the edge connector.

The term "effective width" is intended to mean the width of a feature or, if more than one feature is present, the sum of the widths of those features. For example, for a single edge connector having a width of 2 cm, the effective width for the single edge connector is 2 cm. In another example, for two edge connectors having a width of 1 cm each, the effective width of the two edge connectors is 2 cm.

The term "emission homogeneity" is intended to mean a measure of an emission intensity uniformity over an array. A higher number for emission homogeneity corresponds to a more uniform emission intensity across the array.

The term "electronic device" is intended to mean a collection of circuits, electronic components, or combinations thereof that collectively, when properly connected and supplied with the appropriate potential(s), performs a function. An electronic device may include or be part of a system. An example of an electronic device includes a display, a sensor array, a computer system, an avionics system, an automobile, a cellular phone, other consumer or industrial electronic product, or any combination thereof.

The term "immediately adjacent" is intended to mean that a combination of one or more layers, members, or structures contact one another or there is no other intervening layer, member or structure between such combination of the one or more layers, members, or structures.

The term "lifetime," with respect to an electronic device, is intended to mean a time period over which an electronic device substantially meets its operating specifications. For an electronic device having an array of OLEDs, the lifetime may correspond to a time period from when the electronic device is first fabricated until the emission intensity for one or more OLEDs or an entire display is below a specified limit, such as 50% of the initial emission intensity of an array (e.g., a display) within the electronic device or a portion of the array, in one embodiment.

The term "organic active layer" is intended to mean one or more organic layers, wherein at least one of the organic layers, by itself, or when in contact with a dissimilar material, is capable of forming a rectifying junction.

The term "normal operation" is intended to mean operation of an electronic device as used by an average end-user of the electronic device. Normal operation does not include operating the electronic device while the electronic device is being maintained, serviced, configured, upgraded, or the like. Also, normal operation does not include operation during burn-in, lifetime testing, or other similar testing.

The term "power signal" is intended to mean a signal corresponding to a power supply potential. For example, a power signal can be $V_{DD}$, $V_{SS}$, etc.

The term "radiation-emitting component" is intended to mean an electronic component, which when properly biased, emits radiation at a targeted wavelength or spectrum of wavelengths. The radiation may be within the visible-light spectrum or outside the visible-light spectrum (UV or IR). A light-emitting diode is an example of a radiation-emitting component.

The term "radiation-responsive component" is intended to mean an electronic component, which when properly biased, can respond to radiation at a targeted wavelength or spectrum of wavelengths. The radiation may be within the visible-light spectrum or outside the visible-light spectrum (UV or IR). An IR sensor or a photovoltaic cell is an example of a radiation-sensing component.

The term "rectifying junction" is intended to mean a junction within a semiconductor layer or a junction formed by an interface between a semiconductor layer and a dissimilar material, in which charge carriers of one type flow easier in one direction through the junction compared to the opposite direction. A pn junction is an example of a rectifying junction that can be used as a diode.

The term "substantially ambient temperature" is intended to mean a temperature at one or more points of an electronic device after an array within the electronic device has not been operated for an extended period of time. The substantially ambient temperature can be the same as room temperature or may be different (e.g., electronic circuits outside the array may generate heat to which such one or more points (e.g., the array, an edge connector, etc.) is exposed when the display is not operating).

The term "substantially steady state temperature" is intended to mean a temperature, measured at one or more specific locations (e.g., at an edge connector), wherein the temperature, after a potentially initial transient period, does not significantly change as a function of time.

The term "substrate" is intended to mean a base material that can be either rigid or flexible and may include one or more layers of one or more materials, which can include, but are not limited to, glass, polymer, metal or ceramic materials or combinations thereof.

The term "surface temperature" is intended to mean a temperature as measured at a surface of a layer, member, or structure (e.g., an edge connector).

The term "user surface" is intended to mean a surface of the electronic device principally used during normal operation of the electronic device. In the case of a display, the surface of the electronic device seen by a user would be a user surface. In the case of a sensor or photovoltaic cell, the user surface would be the surface that principally transmits radiation that is to be sensed or converted to electrical energy. Note that an electronic device may have more than one user surface.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Group numbers corresponding to columns within the periodic table of the elements use the "New Notation" convention as seen in the *CRC Handbook of Chemistry and Physics*, 81$^{st}$ Edition (2000–2001).

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Design Considerations

Design considerations, as described below, can be used to achieve higher information content displays, higher emission intensity displays, or both for displays without causing a significant rise in temperature or reduction in emission homogeneity. The design considerations may be used for AM displays, passive matrix ("PM") displays, other displays, arrays of sensors or photovoltaic cells, or any combination thereof using electronic components. In one embodiment, the design considerations may be used for a full-color AMOLED display having at least 320 rows and 240 columns of pixels (each pixel including a red, green, and blue radiation-emitting electronic component), where the display is at least 5 inches. For the purposes of this specification, display sizes are given as a nominal length as measured diagonally between opposite corners of the display. Much of the discussion below is directed to designing AMOLED displays to simplify understanding of the concepts presented below. After reading this specification, skilled artisans will understand and know how to design other electronic devices to achieve low voltage drops and low heat generation within electronic devices.

In AMOLED displays with emission from the substrate side (so-called bottom emission), the control circuits for the electronic components are embedded within the substrate. In one embodiment, the substrate further includes thin film transistors (TFTs). TFTs can have channel regions formed as amorphous silicon (a-Si), low-temperature polysilicon (LTPS), continuous grain silicon (CGS), sequential lateral solidification silicon (SLS), or any combination thereof.

From a user's perspective of the viewing area of the display, the control circuit occupies part of the emission area. The remaining area is occupied by transparent electrode pads (typically made with transparent ITO, IZO, AZO etc.), which serve as one contact electrode (often as the anode) for the electronic components. A common electrode (often the cathode) overlies the organic active layer for all electronic components within the display. Other device configurations can be used.

The effective full-color electroluminescent efficiencies of OLED electronic components are typically in range of approximately 2 to 20 cd/A. For an AM, full-color display with a circular polarizer of approximately 40% optical transmission, the current flowing in a unit area is in range of approximately 2.5 to 25 mA/cm$^2$ for an emission intensity of approximately 200 cd/m$^2$ ("nits"). Table 1 includes total operating current ("$I_{panel}$" in Table 1) for different sizes of AM driven OLED displays.

TABLE 1

Display Sizes and Operating Current

| Format | Panel dimensions | Active Area | $I_{panel}$@200 nits |
|---|---|---|---|
| 7" WVGA, 133 ppi, 800 × RGB × 480 | 6.0" × 3.6" | 150 cm$^2$ | 0.375 to 3.75 A |
| 9.3" WVGA, 100 ppi 800 × RGB × 480 | 8.0" × 4.8" | 250 cm$^2$ | 0.625 to 6.25 A |
| 14.9" WXGA, 100 ppi, 1280 × RGB × 768 | 12.8" × 7.68" | 634 cm$^2$ | 1.59 to 15.9 A |
| 20" UXGA, 100 ppi, 1600 × RGB × 1200 | 16.0" × 12.0" | 1239 cm$^2$ | 3.1 to 31 A |
| 40" UXGA, 50 ppi, 1600 × RGB × 1200 | 32.0" × 24.0" | 4955 cm$^2$ | 12.4 to 124 A |
| 57", 38.7 ppi, 1920 × RGB × 1080 | 49.7" × 27.9" | 8,951 cm$^2$ | 22.4 to 224 A |

In Table 1, "WVGA" is wide video graphics array, "WXGA" is wide extended graphics array, "UXGA" is ultra extended graphics array, and "RGB" refers to red, green, and blue radiation-emitting components within each pixel.

The data above demonstrate that the operating current can be significant for AMOLED displays. For displays using 500 cd/m$^2$ peak luminance, the operating current is approximately 2.5 times larger than those listed in Table 1. Special designs of a common electrode and the power transmission lines in an AM back panel help to make stable AMOLED display operations viable. Moreover, special design of the electrical connectors between the array and other parts of the electronic device, electrical connectors between the back panel and controlling circuit(s) in separate board(s), and the electrical connector between different driving board(s), are desirable for reliable AMOLED display operations. In one embodiment, in a direction parallel to the primary surface of the substrate, the electrical connectors lie between the array and a perimeter of the substrate, such as a back panel, and the electrical connectors can be designed to transmit a power signal (e.g., $V_{SS}$, $V_{DD}$, etc.) into the array. A proper design of the common electrode and electrical connector between each component in the system can help to substantially reduce the effect of or eliminate two problems: voltage drops and heat generation.

The voltage drop along the path from a power source to the electronic components can have two negative impacts: 1) inefficient power delivery during the panel's normal operations, and 2) inhomogeneous emission intensity across the panel. For example, for a 7-inch panel with WVGA resolution (shown in Table 1), the total current is 0.375 to 3.75 A flowing from the external power transmission lines into the common electrode. The contact resistance at a cathode interface or an anode interface should be small enough, so that a substantial voltage drop is not seen at the contact. In one embodiment, the voltage difference between $V_{DD}$ and $V_{ss}$ is approximately 10 V. Therefore, a contact resistance of 1 ohm will cause a voltage drop of 0.375 to 3.75 V. In one embodiment, a one-volt loss (i.e., 9 volts instead of 10 volts as seen by the electronic component) may be used and results in a light intensity decrease of approximately 10%. In another embodiment, a voltage drop of less than 1% may be used, which for a 10 volt difference between $V_{DD}$ and $V_{SS}$ would be 0.1 V. Using Ohm's law, the contact resistance is no greater than 0.267 Ω.

$$R = \frac{V}{I} = \frac{0.1}{0.375 \sim 3.75} \approx 0.267 \sim 0.00267 \Omega \qquad \text{Equation 1}$$

As the size of the panel becomes larger, as the emission intensity increases, or both, the total current flowing into the active area can become very large (see Table 1). The voltage drop can exist anywhere between a power source and the electronic component(s), and in particular, at point(s) farthest from the power source along a conduction path. The voltage drop can occur at connections between the driver board and the panel, the common electrode, the power transmission lines on the panel, the connections between different controlling boards, etc. To reduce the voltage drop, some special designs are provided in the examples described later in this specification.

Current flowing along a conduction path can generate heat. The resistance along a conduction path can cause a voltage drop and consume power. The power consumption by a resistor is described in Equation 2.

$$P = I^2 R \qquad \text{Equation 2}$$

The consumed power is converted into heat. The heat can make the system unstable. In one embodiment, the temperature of a conductive member or a portion thereof (e.g., an edge connector), due to current flowing through the conductive member or portion thereof, may be no more than 10° C. The temperature increase can be determined by subtracting a first temperature from a second temperature. In one embodiment when an edge connector is being used, the first temperature can be obtained by measuring the temperature of the edge connector when such edge connector is at a substantially steady state temperature. In a particular embodiment, the current flows through the edge connector under normal operating conditions for approximately 10 minutes before the temperature is measured.

The second temperature can be the substantially ambient temperature near the edge connector when current has not flowed for an extended period of time. Note that the second temperature could be the air temperature outside the device or may be different (e.g., a higher temperature due to other electronic circuits within the electronic device that continue to operate). In one embodiment, the second temperature may be taken at steady state (no significant temperature change with time). If the electronic device had been operating, an hour or other suitable time may be allowed to pass before the second temperature is taken.

In a particular embodiment, the temperature difference due to current flow can be determined by Equation 5 below, where ΔL is the length of the edge connector.

Both the lifetime and emission homogeneity of electronic components can be affected by temperature. In one embodiment, initial emission intensity of the array (e.g., the display) or a portion of the array may be measured. In one embodiment, the useful life of the electronic device may continue until the array or portion of the array has an emission intensity that is at least 50% of the initial emission intensity. Therefore, in this embodiment, the lifetime can extend from the time the display is fabricated until the display or a portion of the display has an emission intensity less than 50% of the initial emission intensity. Note that the initial emission intensity does not have to be measured immediately after fabrication and can be measured at nearly any time before measuring the emission intensity at a later time.

The lifetime of a radiation-emitting component can be reduced by approximately 90% by operating the radiation-emitting component at 65° C. versus room temperature (approximately 20° C.). For every 5 to 10° C. increase in temperature, the lifetime of the radiation-emitting component can be reduced by approximately 50%. Local heating at an electrical connector, which can be caused by locally high electrical current, can result in a hot spot, and radiation-emitting electronic components near the hot spot may be at a higher temperature as compared to other radiation-emitting electronic components further from the hot spot. The temperature differential can produce a lifetime gradation differential in the radiation-emitting electronic components, thus, resulting in emission homogeneity that becomes lower the longer the electronic device operates. In a particular embodiment, the temperature rise may be no more than 10° C. In another embodiment, the temperature rise may be no greater than 5° C. In still another embodiment, a temperature rise of no more than 1° C. may be used.

From Equation 2, for a fixed current, as the resistance becomes smaller, the power consumption is lower, and therefore, the heat generation is likewise lower. Example 1 provides a theoretical approach to the design requirement for the reduction of the heat in accordance with one embodiment. Other examples are also illustrated to reduce or eliminate the negative effects caused by large current. Still other examples illustrate how to design the common electrodes, the electrical conduction path between the power source and the individual electronic components, the electrical connectors within the whole system, and other concerns concerning the space (area), crosstalk, electrical shorts, etc.

By improving the design of conductive members or portions thereof, such as the edge connectors, local heating can be significantly reduced. Thus emission homogeneity may be at least 75%, and potentially at least 90% or 95% over the lifetime of the electronic device.

For the purposes of this specification, emission homogeneity compares at least two, functional radiation-emitting components that represent the highest and lowest emission intensities of an array. A functional radiation-emitting component is a component that allows for a perceptible change (by a human with average eyesight) in emission intensity with a change in a driving signal (e.g., drive current to such radiation-emitting component). Radiation-emitting components having electrical opens or electrical shorts would be non-functional and would not have a perceptible change in emission intensity. Each of the highest and lowest emission intensity is the higher of (i) the specified emission intensity for the radiation-emitting component or (ii) the highest achievable emission intensity if such radiation-emitting component cannot achieve the specified emission intensity and still remaining within the specified electrical design limits (e.g., current for such radiation-emitting component). In one embodiment, the emission homogeneity is determined on a color-by-color basis (red, green or blue) or for a combination of colors (e.g., red, green, and blue).

3. EXAMPLES

The invention will be further described in the following examples, which do not limit the scope of the invention described in the claims.

Example 1

Example 1 demonstrates how the design considerations previously given may be used in designing and fabricating a common electrode for a display panel. For a large size (e.g., >5"), full color, AMOLED display panel with high resolution, efficient power importing from the power source to the panel is desired. A poor design of any portion of the conductive member, such as an edge connector, could induce high temperature and could even prohibit the current flow. The design considerations are better understood when considered with respect to FIG. 1.

In FIG. 1, I is electrical current, $\Delta L$ is a unit of length of the conductive member, h is the thickness of the conductive member, and W is the width of the conductive member. For electrical current I, the total power generated is $I^2R$, where R is the resistance of the conductive member. Using Ohm's law, the resistance of the conductive member is:

$$R = \rho_R \times \Delta L / (h \times W) \qquad \text{Equation 3}$$

where $\rho_R$ is the electrical resistivity of the material used for the conductive member. For aluminum at 25° C., $\rho_R$ is $2.709 \times 10^{-8}$ $\Omega \cdot m$, and for copper at 25° C., $\rho_R$ is $1.712 \times 10^{-8}$ $\Omega \cdot m$.

The temperature increase of the conductive member is dependent on the thermal resistance of the display panel and the power, as given in Equation 4.

$$\Delta T = \rho_T \times P / S \qquad \text{Equation 4}$$

where $\rho_T$ is the thermal resistivity of the display panel in units of $°C. \cdot cm^2 / W$, P is the power, and S is the cross-sectional area from a plan view of the conductive member. When substituting $I^2R$ for P and $\Delta L \times W$ for S, the temperature increase is given in Equation 3.

$$\Delta T = \rho_T \frac{P}{S} = \rho_T \frac{I^2 R}{\Delta L \times W} \qquad \text{Equation 5}$$

Note that after an electronic device has been designed and fabricated, I may be the only operating parameter that can be changed, however, the specification limits (e.g., current, emission intensity, etc.) for the electronic device may not limit how high or low the current may be under normal operating conditions. Substituting Equation 1 for R, and solving for W gives:

$$W = (\rho_T \times \rho_R \times I^2 / (h \times \Delta T))^{0.5} \qquad \text{Equation 6}$$

This result indicates that for a given package scheme and enclosure environment (related to a fixed panel temperature increase), the width of the conductive member is proportional to the total operating current and square root of the electrical resistivity of the wiring material and is inversely proportional to the square root of the thickness (h) of the conductive member and the temperature increase.

W represents a calculated width. The effective width of any or all portions of a conductive member may be at least 80% of the calculated width. In one embodiment, the effective width is at least as wide as the calculated width. In another embodiment, the effective width is approximately 120% of the calculated width. After reading this specification, skilled artisans will be able to determine the actual effective width to be used based on their needs.

Figure 2:
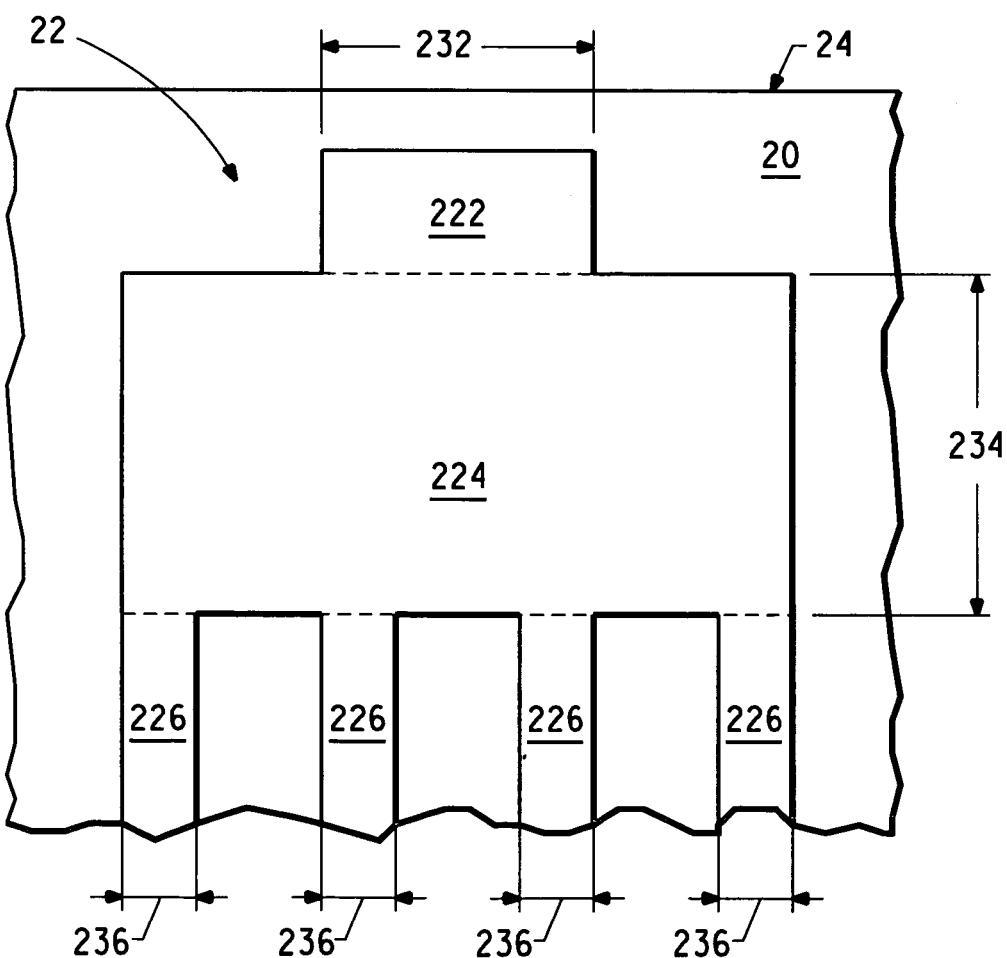
FIG. 2 includes an illustration of a plan view of a conductive member to better illustrate width, as a direction relative to current flow, and effective width.

Although effective width is defined earlier in this specification, the concept is better understood with the illustration in FIG. 2. FIG. 2 includes an illustration of a plan view of a conductive member 22 overlying a substrate 20. The conductive member 22 includes an edge connector 222, a power transmission line 224, and additional power transmission lines 226, which may or may not extend into an array of electronic components. The edge connector 222 can be used to transmit a power signal, and therefore, can be a power supply terminal. In one embodiment, the edge connector 222 is a male edge connector that can receive a female edge connector (not shown) that is electrically coupled to an external power. In one particular embodiment, the conductive member 22 may be biased to $V_{DD}$ or $V_{SS}$ when the display is operating. The edge connector 222 can be an edge connector that lies between an array (not illustrated) and a perimeter 24 of the substrate 20. In one embodiment, within the conductive member 22, the principal current flow is from the edge connector 222 to the power transmission line 224 and then to the additional power transmission lines 226. In another embodiment, the principal current flow is in an opposite direction. Referring to FIG. 2, the overall current flow may be from top to bottom or bottom to top.

Width is in a direction substantially perpendicular to a principal current flow. The principal current flow within the edge connector 222 is from the top-to-bottom of the edge connector 222 in FIG. 2, and therefore, the width 232 is the side-to-side dimension of the edge connector 222. Similarly, the principal current flows within the additional power transmission lines 226 are from the top-to-bottom in FIG. 2, and therefore, the widths 236 are the side-to-side dimensions of the power transmission lines 226. The power transmission line 224 routes current between the edge connector 222 and additional power transmission lines 226, which means a principle current flow in the power transmission line 224 is side-to-side in FIG. 2. Therefore, the width 234 of the power transmission line 224 is a top-to-bottom dimension in FIG. 2.

Based on a design of one embodiment, a calculated width of a conductive member may be 3.9 cm. To provide an operational cushion, 4.0 cm may be used as the effective width of the conductive member. The edge connector 222 has an actual width 232 and an effective width of 4.0 cm. Similarly, the power transmission line 224 has an actual width 234 and an effective width of 4.0 cm. Four additional power transmission lines 226 have substantially the same actual width 236. In this embodiment, the effective width is 4.0 cm, and therefore, each of the actual widths 236 is 4.0 cm/4 (the number of additional power transmission lines) or 1.0 cm. If a total of eight additional power transmission lines 226 are used (not shown in FIG. 2), the actual widths would be 4.0 cm/8, or 0.5 cm.

In one embodiment, the actual widths for the additional power transmission lines 226 may be different. For example, if the center two additional power transmission lines 226 are designed to carry twice as much current flow at the outer two additional power transmission lines 226, the actual widths of the center two additional power transmission lines 226 can be 1.5 cm, and the actual widths of the outer two additional power transmission lines 226 can be 0.75. Because the effective width can be the sum of the individual active widths, the effective width remains unchanged at 4.0 cm (0.75 cm+1.5 cm+1.5 cm+0.75 cm).

After reading this specification, skilled artisans will appreciate that more complicated designs may be achieved using the basic principles as described with respect to FIG. 2. For example, the actual width of the power transmission line 224 may be narrower near the sides of FIG. 2 as compared to the center of FIG. 2 because those parts of the power transmission line 224 are only supplying current to the outer additional power transmission lines 226.

Example 3

Example 3 demonstrates that the thickness of an electrically conductive member can affect the voltage drop and heat generated when current flows through the electrically conductive member. Referring to Equation 6 in Example 2, if the conductive member is four times as thick, the effective width can be reduced in half, assuming no other changes in the design or operation of the display panel. Different methods of forming the conductive member may be used depending, at least in part, on the thickness of the conductive member.

In one embodiment, the conductive member may not only include one or more electrodes (e.g., anodes or cathodes for electronic components), but the conductive member can include one or more edge connectors and may or may not include one or more power transmission lines between the edge connector(s) and electrode(s). In one embodiment, the conductive member may be formed using a physical vapor or chemical vapor deposition technique. In a particular embodiment, the conductive member may be formed by depositing and patterning a conductive layer or by depositing the conductive member as a patterned layer using a stencil mask.

Although not theoretically limited, the thickness using a vapor deposition technique is typically up to 5.0 microns. At thicknesses higher than 5.0 microns, equipment throughput may be too low. In one embodiment, the upper limit based on the equipment throughput consideration may be 2.0 microns.

For a thicker conductive member, plating may be used. A plating apparatus and method, such as the one described in U.S. Pat. No. 6,174,425, can be used to plate the conductive member over a seed layer. The seed layer can include an electrically conductive material from which plating may occur. In one set of embodiments, the seed layer can include a metal-containing member and has a thickness in a range of 0.05 to 0.2 microns. The thickness range of the seed layer is not a theoretical limit, but more of a practical consideration. In one embodiment, an electrically insulating material is exposed at areas not covered by the seed layer. Typically, the electrically conductive material does not plate onto the electrically insulating material. In one embodiment, the seed layer is patterned to correspond to the electrode(s), edge connector(s), power transmission lines, or any combination thereof.

The seed layer can be electrically connected to the cathode of the plating apparatus. An electrically conductive material is plated over the seed layer but is not significantly plated over the patterned electrical insulating layer. The electrically conductive material can include a metal, mixed metal, alloy, or a combination thereof. Exemplary metallic elements used in the conductive material may include Ni, Cu, Au, Ag, Pt, Pd, or combinations thereof.

Although not theoretically limited, the thickness using a plating technique is typically up to 100 microns. At thicknesses higher than 100 microns, equipment throughput may be too low. In one embodiment, the upper limit based on the equipment throughput consideration may be 10 microns.

For an even thicker conductive member, a foil, sheet, or plate may be used. In one embodiment, a foil may have a thickness in a range of approximately 10 microns to 100 microns, a sheet (e.g., sheet metal) may have thickness in a range of 50 microns to 2 mm, and a plate (e.g. boilerplate) may be at least 2 mm thick. Differences between the foil, sheet, and plate can be the ease at which it can be shaped to match the surface of another object. A foil may be more easily shaped to match the surface, a sheet may require some tools (e.g., a hammer or mallet) but may be shaped at about room temperature, and a plate may require relatively high temperatures to shape. An electrode (e.g., cathode) may be part of or separate from the foil, sheet, or plate. For simplicity, the embodiments using the foil, sheet, or plate, as described in more detail below, place the foil, sheet or plate over the electrode.

The foil, sheet, or plate may include one or more metals, metal alloys, or a combination thereof. Some exemplary materials include Al, Cu, Au, Ag, In, Sn, Bi, Pb, Hg, Ga, Cd, any alloy of such metals, or any combination thereof. In one embodiment, the foil, sheet, or plate may have a thickness of at least 100 microns. Similar to vapor deposition and plating techniques, the foil, sheet, or plate does not have a theoretical upper thickness limit. In one embodiment, the foil may not be thicker than 10 mm due to practical considerations. For example, if an OLED display panel is used in a cellular phone or personal digital assistant, the OLED display panel may be limited to 6 mm, and therefore, the foil, sheet, or plate may not be thicker than 5 mm (to allow 1 mm for the substrate and other portions of the display panel).

Many different techniques can be used to attach the foil, sheet, or plate to the display panel. In one embodiment, electrically conductive discrete structures (e.g., metal balls) can be used to help electrically connect the foil to underlying electrodes or insulating materials. In another embodiment, the discrete structures may be deposited onto a common electrode by vapor deposition or printing.

Many different combinations of vapor depositions, plating, and a foil, sheet, or plate may be used to form electrodes, edge connectors, power supply lines, and other conductive members lying along an electrical conduction path.

Example 4

Example 4 demonstrates that edge connectors for a common electrode AMOLED display can be designed and implemented in specific layouts. In Example 4, a conductive member for a 9.3" AMOLED display is being designed.

A 9.3" AMOLED full-color display panel has an operating current in a range of approximately 0.625 to 6.25 A to achieve 200 cd/m$^2$ (nits) emission intensity (see Table 1 above). For design purposes, about 30 percent of the maximum operating current (approximately 6.25 A) is used, and therefore, the operating current, for design purposes, is approximately 2 A. In this example, a common electrode (Al) is used and has a thickness of approximately 0.6 microns. The common electrode is a common cathode for the electronic components within the AMOLED display. The thermal resistivity of the display panel is approximately 200° C.·cm$^2$/W. Table 2 below illustrates how the calculated width (W) of the conductive member(s) varies with different temperature increases ($\Delta T$).

TABLE 2

Affect of Temperature Increase on Width

| $\Delta T$ (° C.) | W (cm) |
|---|---|
| 1 | 6 |
| 5 | 2.7 |
| 10 | 1.9 |

Figure 3:
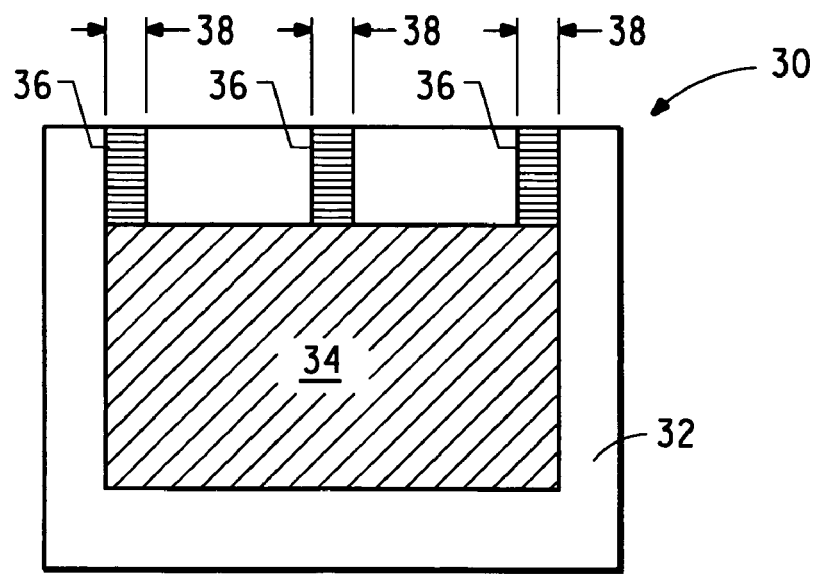
FIGS. 3 to 7 include illustrations of plan views of back panels that include conductive members, where each conductive member includes a common electrode and edge connector designs in accordance with different embodiments.

Referring to FIG. 3, the display 30 is in a WVGA format, 100 pixels per inch ("ppi"), and 800×RGB×480 layout configuration. The display 30 includes a back panel 32, which is a specific type of substrate, and electronic components overlying the back panel 32. The electronic components are OLEDs in this example. The display has an active area of approximately 8.0"×4.8". The common electrode 34 has a shape that substantially corresponds to the active area and overlies the back plane 32. Edge connectors 36 are formed at the same time as the common electrode 34 and are part of the same conductive member. In this example, the display panel is designed for a temperature increase of 1° C. Each of the edge connectors 36 has an actual width 38 of approximately 2.0 cm, and therefore, the edge connectors 36, collectively, have an effective width of approximately 6.0 cm. A stencil mask used for depositing the common cathode can be modified to include openings for the edge connectors 36. In this example, the edge connectors 36 are formed without any additional steps.

Figure 4:
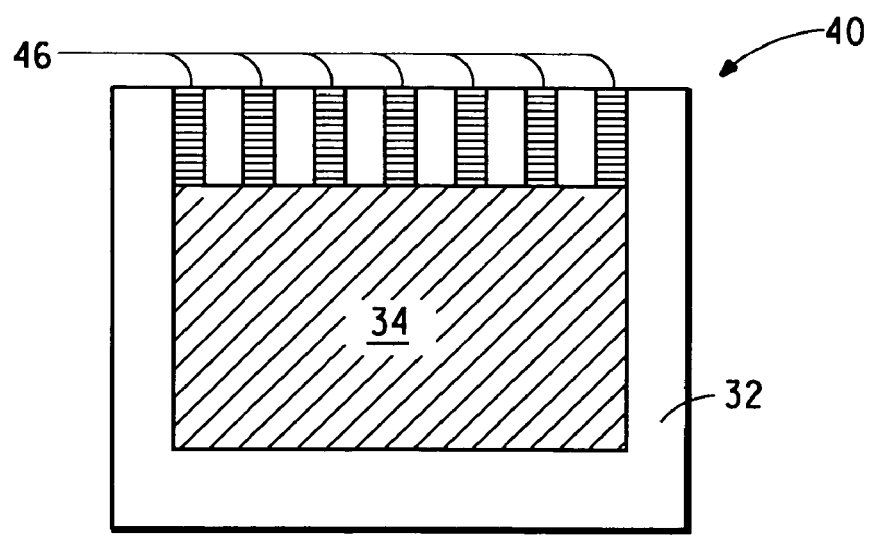
Figure 5:
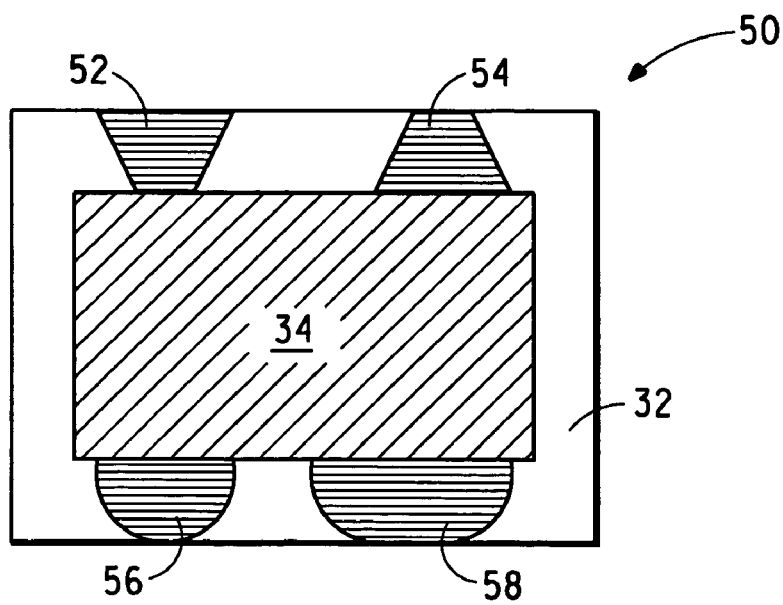
Figure 6:
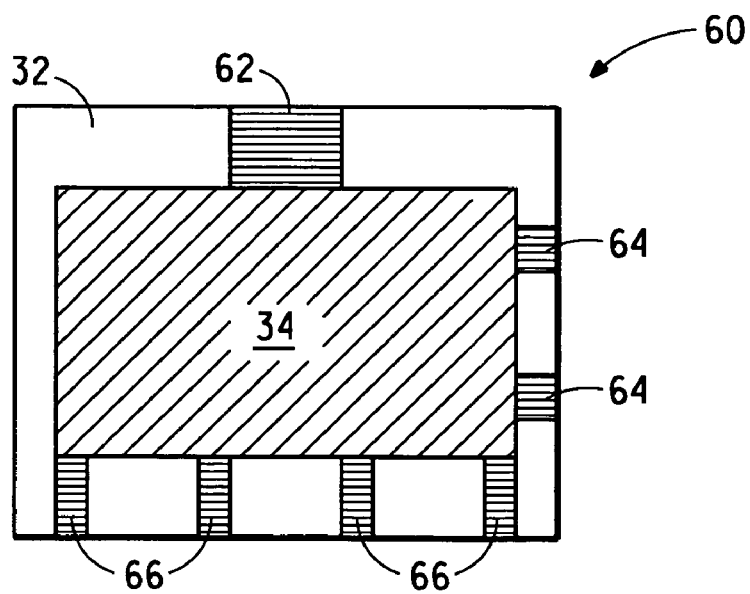
Figure 7:
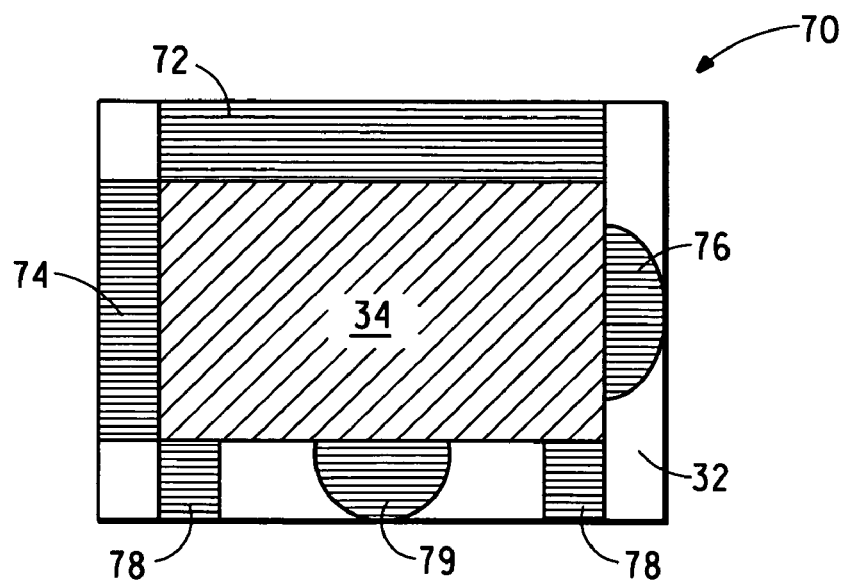

FIGS. 4 to 7 illustrate non-limiting embodiments of other edge connector designs. In FIG. 4, the display 40 has more edge connectors 46 compared to display 30. FIG. 5 illustrates that edge connectors may have different shapes and lie along opposite edges of the back panel 32. In FIG. 5, display 50 includes trapezoid-shaped edge connectors 52 and 54, a partial circle shaped edge connector 56, and a partial oval shaped edge connector 58. Note the edge connectors 52 and 54 have different orientations. Edge connector 52 is wider near the edge of the back panel 32 and narrower near the common electrode 34, and the edge connector 54 is narrower near the edge of the back panel 32 and wider near the common electrode 34. FIG. 6 illustrates a display 60 where edge connectors 62, 64, and 66 lie near three different edges of the back panel 32. In one embodiment of FIG. 6, the width of edge connector 62 is equal to the sum of the widths of the edge connectors 64 and is equal to the sum of the widths of the edge connectors 66. FIG. 7 illustrates a display 70, wherein edge connectors lie along all four edges of the back panel 32. Note that the edge connectors may have different shapes along different edges of the back panel 32 (edge connector 76 compared to edge connectors 72 and 74) and different shapes along the same edge of the back panel (edge connectors 78 compared to edge connector 79).

After reading the specification, skilled artisans appreciate that many other edge connector designs are possible and that the effective width for the edge connectors can be wider than the calculated width. The use of edge connectors along each edge of the substrate may help to distribute current flow more evenly.

Example 5

Figure 8:
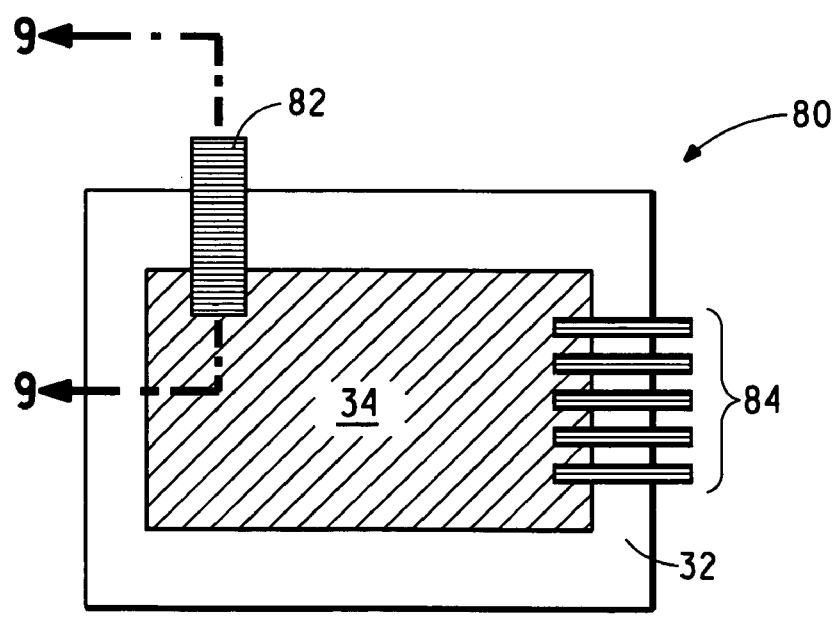
FIGS. 8 and 9 include illustrations of a plan view and a cross-sectional view, respectively, of separate common electrode and edge connectors overlying a back panel in accordance with one embodiment.
Figure 9:
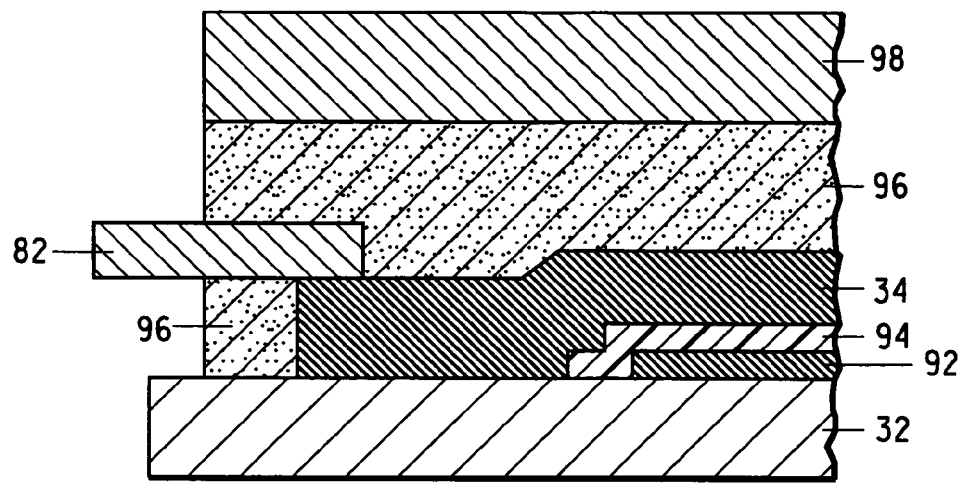

Example 5 demonstrates that edge connectors can be conductive members separate from the common electrode. FIG. 8 includes an illustration where a display 80 includes the back panel 32 and common cathode 34. In one embodiment, the edge connectors 82 and 84 are electrically connected to the common electrode 34. FIG. 9 includes a cross-sectional view of the display at sectioning line 9—9 in FIG. 8. FIG. 9 includes the back panel 32, a first electrode 92 (e.g., an anode), an organic layer 94 that may include (i) an organic active layer, (ii) a buffer layer, charge-blocking layer, a charge-transport layer, a charge-injecting layer, or any combination thereof, (iii) the common electrode 34, (iv) the edge connector 82, (v) an epoxy layer 96, and (vi) an encapsulation cap 98. In one embodiment, the edge connectors 82 and 84 may be attached to the common electrode 34 using an adhesive, soldering, or the like. In another embodiment, the edge connectors 82 and 84 may be held in place by a jig or other mechanical apparatus. The epoxy layer 96 is deposited over the edge connectors 82 and 84 and along sides of the common electrode 34. An encapsulation cap 98 is placed over the epoxy layer 96. Each of the epoxy layer 96 and the encapsulation cap 98 may be electrically conductive or electrically insulating. The epoxy layer 96 may or may not be cured, and if cured, the epoxy layer 96 may be cured before or after the encapsulation cap 98 is placed over the epoxy layer 96.

Any one or more of the edge connectors 82 and 84 may be flat or round or other suitable shape. In another embodiment, fewer or more edge connectors could be used. The edge connectors 82 and 84 can be connected to a power conductor. The power conductor could be one single wire or a couple of wires or a set of wires imbedded in some medium flexible or rigid, like flexible printed circuit ("FPC") cables. One or several wires could be connected onto any position of the common electrode depending on the design requirements and convenience.

Example 6

Example 6 demonstrates that a multifunctional common electrode may be used. In one embodiment, the multifunctional common electrode can include an electrically conductive encapsulation cap.

Figure 10:
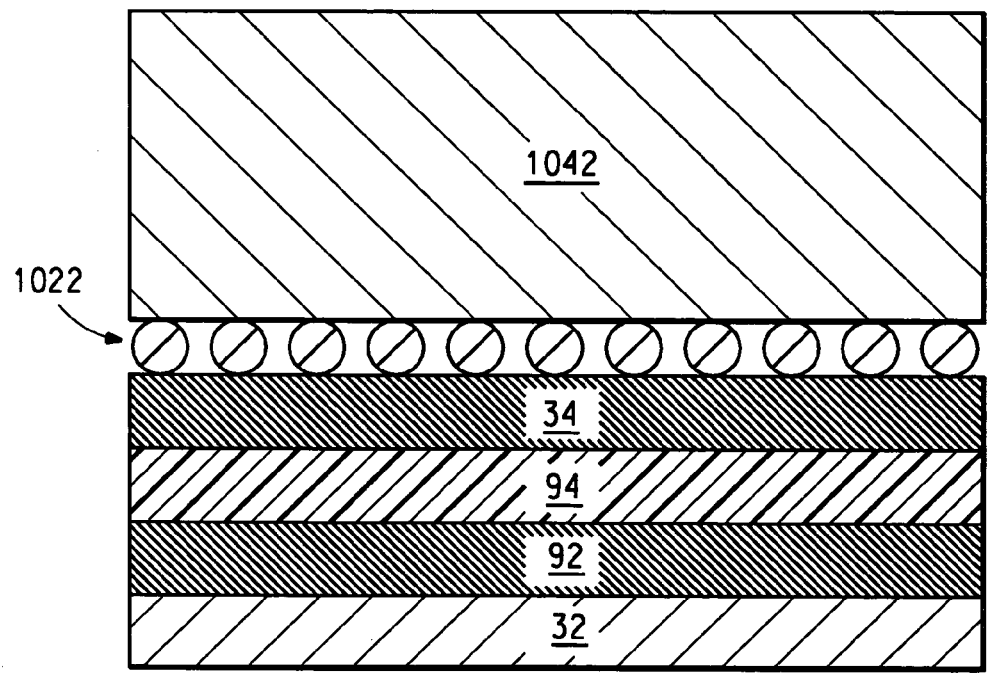
FIG. 10 includes an illustration of a cross-sectional view of a portion of a display for an electronic device having a multifunctional electrode.

Referring to FIG. 10, in one embodiment, the electrical connector 1042 can be an encapsulation cap that overlies an array (not illustrated) and has sides that lie between the array and perimeter of the substrate, which is the back panel 32. The electrical connector 1042 can extend outside the array and be closer to a perimeter of the back panel 32, as compared with the array.

The electrical connector 1042 can be a foil, sheet, or plate and includes one or more metals, metal alloys, or a combination thereof. Some exemplary materials include Al, Cu, Au, Ag, In, Sn, Bi, Pb, Hg, Ga, Cd, any alloy of such metals, or any combination thereof. In one embodiment, the electrical connector 1042 can be 100 to 1000 times thicker than the common electrode 34. In another embodiment, the electrical connector 1042 may have a thickness of at least 100 microns. The electrical connector 1042 does not have a theoretical upper thickness limit. In one embodiment, the electrical connector 1042 may not be thicker than 10 mm due to practical considerations. For example, if an OLED display panel is used in a cellular phone or personal digital assistant, the OLED display panel may be limited to 6 mm, and therefore, the electrical connector 1042 may not be thicker than 5 mm (to allow 1 mm for the back panel and other portions of the display).

Many different techniques can be used to attach the electrical connector 1042 to the common cathode 34. In one embodiment, electrically conductive discrete structures 1022 (e.g., metal balls) can be used to help electrically connect the foil to underlying electrodes or insulating materials.

In one specific embodiment, the discrete structures 1022 and electrical connector 1042 may be placed over the electrode(s) and exposed to soldering conditions that allow the discrete structures 1022 to become a soldering material to connect and attach the common electrode 34 to the electrical connector 1042. In one embodiment, the discrete structures 1022 include a low melting point metal or metal alloy. The metal or metal alloy may comprise In, Sn, Bi, Pb, Hg, Ga, Cd, any alloy of such metals, or any combination thereof. The metal or metal alloy may have a melting point greater than 85° C. because the electronic device may be subjected to tests as high as 85° C. The metal or metal alloy may have a melting point less than 240° C. to reduce the likelihood of damage to the organic layer 94 within the electronic device. A melting point in a range of 130° C. to 150° C. may be used in one embodiment. In such an embodiment, alloys of In, Sn, and Pb may have eutectic temperatures in the range of 130 to 150° C.

In another embodiment, discrete structures 1022 may be placed on a tape. The discrete structures 1022 can be loaded onto the tape to help keep the discrete structures 1022 in place over the common electrode 34. The electrical connector 1042 may be placed over tape with the discrete structures 1022. The composition of the electrical connector 1042 and discrete structures 1022 can be similar to those previously described. The electrical connector 1042 and back panel 32 are pressed together in the presence of heat to melt the discrete structures 1022 and provide electrical and physical contact between the electrode and the electrical connector 1042. Pressure may be applied to the back panel 32, the electrical connector 1042, or both to achieve a pressure differential to keep the relative positions of the electrode(s), discrete structures 1022 and electrical connector 1042 in place.

In still another embodiment, the discrete structures 1022 can be elastic metal-containing balls. The elastic metal-containing balls may include an epoxy or other bonding material. In one specific embodiment, the elastic metal-containing balls comprises at least 17 volume percent of a metal or a metal alloy including Al, Ag, Ni, Cr, Cu, Pt, In, Sn, Bi, Pb, Hg, Ga, Cd, an alloy thereof, or any combination thereof. Note that even when the elastic metal-containing balls includes at least 17 volume percent of a metal or metal alloy, the elastic metal-containing balls may or may not be electrically conductive when placed over an electrode or other layer or structure that overlies the back panel 32. In one embodiment, the elastic metal-containing balls may not be electrically conductive when placed on the electrode or other layer or structure but may become conductive after curing. The elastic metal-containing balls may be placed onto the common electrode 34 or other layer or structure overlying the back panel 32, or the elastic metal-containing balls may be placed onto the electrical connector 1042 before the ball-electrical connector 1042 combination is placed over the common electrode 34 or other layer or structure overlying the back panel 32. Pressure may be applied to the back panel 32, the electrical connector 1042, or both to achieve a pressure differential to keep the relative positions of the electrode(s), discrete structures 1022 and electrical connector 1042 in place.

In yet another embodiment, the discrete structures 1022 can include can dielectric-coated metal-containing balls. Any one or more of the metal balls described above can be coated with a relatively thin layer of a dielectric material. The dielectric material can include silicon dioxide, silicon nitride, alumina, polycarbonate, or other inorganic or organic dielectric material. The dielectric material is similar to an eggshell in that it protects the materials inside, such as an electrically conductive metallic material until the dielectric material is cracked. Therefore, the thickness of the dielectric material should be sufficiently thin to allow the dielectric material to crack without causing significant damage to adjacent portions of the electronic device. In one embodiment, the dielectric-coated metal balls are placed on an common electrode 34 or other layer or structure overlying the back panel 32, on the electrical connector 1042, or any combination thereof. Pressure may be applied to the back panel, the encapsulation cap, or both to achieve a pressure differential to crack the dielectric coating and allow the metal-containing material to make electrical and physical connection with the electrical connector 1042 and the common electrode 34, or other layer overlying the back panel 32.

In further embodiments, other methods and types of discrete structures 1022 may be used. The materials and techniques used in flip-chip connections (e.g., conductive bumps, solder balls, or the like) or direct chip attach as used in the semiconductor industry when attaching an integrated circuit to packaging substrate may be used.

Example 7

Example 7 demonstrates that similar design principles previously described can be used for the $V_{DD}$ line (connected to the power TFT for each radiation-emitting component) in AMOLED panels.

Figure 11:
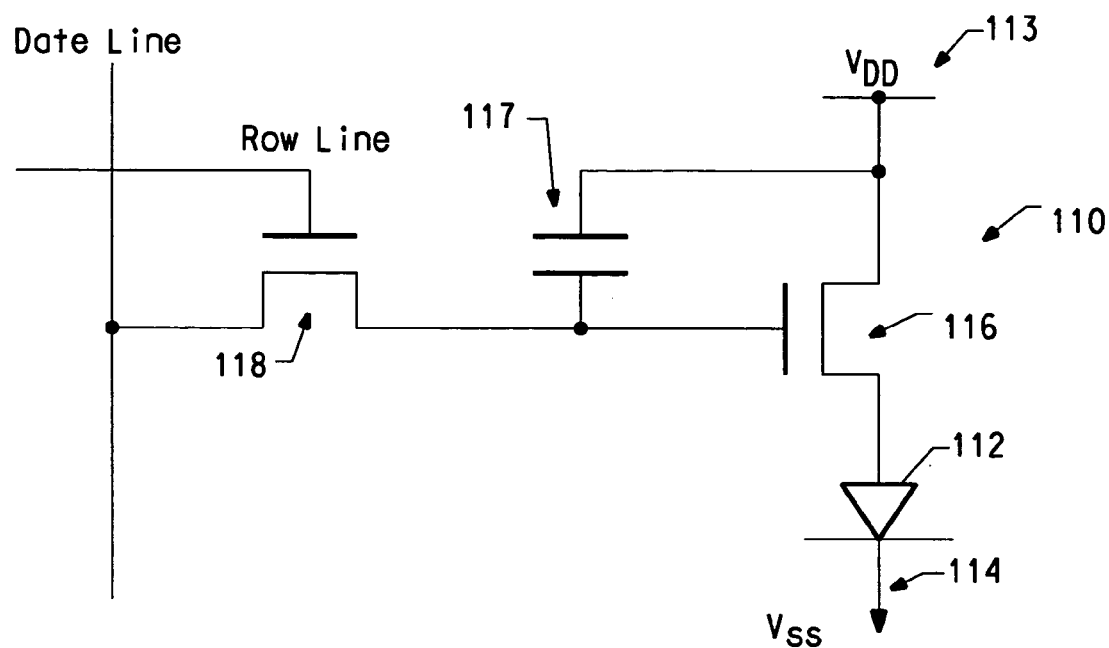
FIG. 11 includes a circuit diagram of a control circuit used with an electronic component.

As shown in the embodiment illustrated in the circuit diagram of FIG. 11, a conventional 2-T, 1-C control circuit 110 is used for an electronic component 112. In one embodiment, the electronic component is a radiation-emitting component 112, which is electrically coupled to $V_{SS}$ 114 and $V_{DD}$ 113. More specifically, $V_{DD}$ 113 is electrically connected to a drain of the n-channel transistor 116 and an electrode of a capacitor 117, a source of n-channel transistor 116 is electrically connected to an anode of the electronic component 112, and the cathode of the electronic component is electrically connected to $V_{SS}$ 114. In one embodiment, a common electrode may be used for the cathode of the electronic component 112. In another embodiment, each electronic component may have its own cathode. The gate of the n-channel transistor 116 is electrically connected to the other electrode of the capacitor 117 and a source/drain of the n-channel transistor 118. The other source/drain of the n-channel transistor 118 is electrically connected to a data line, and the gate of the n-channel transistor 118 is electrically connected to a row line.

In other embodiments, other control circuits can be used. In one embodiment, p-channel, bipolar, or junction field-effect transistors can be used instead of or in conjunction with the n-channel transistors. In another embodiment, the anode of the electronic device 112 can be electrically connected to $V_{DD}$ 113 and coupled to $V_{SS}$ 114 via a transistor (not shown). In that embodiment, the common electrode may include anodes for the electronic component 112 and other electronic components (not shown). Such other electronic components would have their own control circuits. After reading this specification, skilled artisans appreciate that they can chose or design many different control circuits to be used with electronic components.

Referring to FIG. 11, when the n-channel transistors 116 and 118 are biased on, current can flow through those n-channel transistors 116 and 118. Current flows from $V_{DD}$ 113, though n-channel transistor 116 and electronic component 112 to $V_{SS}$ 114. Substantially the same current flows from $V_{DD}$ to $V_{SS}$. Therefore, $V_{DD}$ edge connectors and power transmission lines carry as much current as $V_{SS}$ does. Therefore, the design considerations for voltage drop and temperature increase during operation also apply to the $V_{DD}$ edge connectors and power transmission lines.

Figure 12:
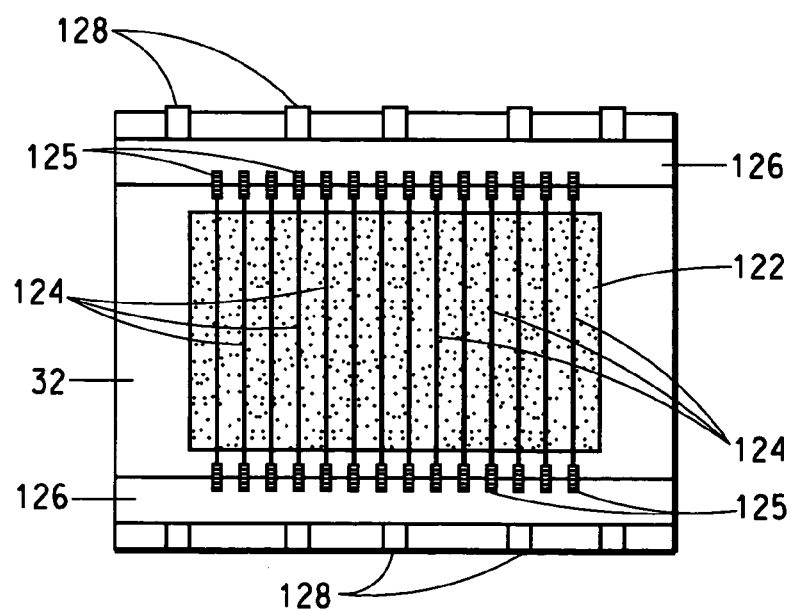
FIG. 12 includes a plan view of $V_{DD}$ edge connectors and $V_{DD}$ power transmission lines overlying a back panel in accordance with one embodiment.

In one embodiment, as illustrated in FIG. 12, $V_{DD}$ power transmission lines 124 are embedded in the back panel 32. The active area 122 corresponds to the area of the back panel 32 over which columns of radiation-emitting components will be subsequently formed. $V_{DD}$ power transmission lines 124 extend across the active area 122. In one embodiment, the $V_{DD}$ power transmission lines 124 may be arranged to lie between electronic components as seen from a plan view from the user side of the electronic device to reduce the visible appearance of the $V_{DD}$ power transmission lines 124 by users. Drains of the transistors 116 are electrically connected to the $V_{DD}$ power transmission lines 124. The $V_{DD}$ power transmission lines 124 are fanned out from the active area 122 at locations 125 and connected to wide $V_{DD}$ power transmission lines 126. In one embodiment, the wide $V_{DD}$ power transmission lines 126 could also serve as the edge connectors. In another embodiment, the wide $V_{DD}$ power transmission lines 126 are connected to an external power source by edge connectors 128. FIG. 12 illustrates for both embodiments.

Many other embodiments are also possible. For example, one or more additional $V_{DD}$ power transmission lines 124, one or more additional wide $V_{DD}$ power transmission lines 126, one or more additional edge connectors 128, or any combination thereof could be used. In one embodiment (not illustrated), the $V_{DD}$ edge connectors 128 lie along all the edges of the back panel 32, the wide $V_{DD}$ power transmission lines 126 may form a frame around the active area 122, and some of the $V_{DD}$ power transmission lines 124 can extend in a vertical direction and other of the $V_{DD}$ power transmission lines 124 can extend in a horizontal direction to form a grid (rather than just vertical lines, as illustrated in FIG. 12) within the active area 122. In one embodiment, radiation is transmitted through the back panel 32. In such an embodiment, the design (sizing and positioning) of the $V_{DD}$ power supply lines 124 does not substantially interfere with the use of the electronic device as seen by a user. In one embodiment, radiation is not transmitted through the back panel (e.g., a top-emission electronic device). In such an embodiment, more latitude may be used in designing the power supply features within the $V_{DD}$ power supply plane. For example, a common electrode may be used instead of or in conjunction with the $V_{DD}$ power transmission lines 124.

The width, material, thickness, temperature increase and other design considerations of the power transmission lines for $V_{DD}$ are substantially the same as those for the power connections for the common electrode previously described. Two of those design considerations include (1) keeping the voltage drop across the power supply plane low; and (2) keeping the heat generated by the edge connectors and power transmission lines low. After reading this specification, skilled artisans will be able to design $V_{DD}$ power supply features to meet their particular specifications.

In still another embodiment, other or additional edge connectors and power transmission lines used in the electronic device can be designed using the concepts described herein. In a further embodiment, the design considerations may be used for the data or row lines to reduce voltage drop along those lines.

Example 8

Example 8 demonstrates that widths of $V_{DD}$ power transmission lines within an active area can be designed using the considerations previously described. In Example 8, the widths of the $V_{DD}$ power transmission lines 124 in FIG. 12 are being considered In one embodiment for an AMOLED display, each $V_{DD}$ power transmission line will carry a current of $I_{pixel}$ times the number of rows because the $V_{DD}$ power transmission lines are vertically arranged as illustrated in FIG. 12. In another embodiment, the orientation may be changed such that the electrical connections for the rows and columns are reversed. In such an embodiment, the $V_{DD}$ power transmission lines within the active area would be $I_{pixel}$ times the number of columns. In one embodiment, a full color display is designed, and each pixel includes a red electronic component, a green electronic component, and a blue electronic component. In one embodiment, a monochromatic display is designed, and each pixel includes one electronic component. Therefore, $I_{pixel}$ may include one or more electronic components.

For a 9.3" diagonal AMOLED panel, the total panel current is of the order of 2 A for the targeted brightness. The panel can be designed in WVGA format, with 8"×4.8" active area with resolution of 100 ppi. Each electronic component has a current of approximately 1.5 µA. The $V_{DD}$ power transmission line 124 is 1 microns thick and 7 microns wide. Each $V_{DD}$ power transmission line 124 carries a current of 400×1.5 µA. The voltage drop from the first pixel to the last pixel along the $V_{DD}$ power transmission line is 1.5%. Following the equations in Example 1 and other characteristics as presented in Example 4 (electrical and thermal resistivities, etc.), the temperature rise would be 4° C. The temperature rise satisfies the criterion set as less than 5° C., though the uniformity is a little bit lower than desired. To reduce the nonuniformity to less than 1% across the panel, either the width or the thickness of the $V_{DD}$ power transmission line 124 is increased. From a practical standpoint, the thickness can be in the range of 0.5 to 500 microns, and therefore, the width is in the range of 5 to 50 microns depending on the pixel size, so as to not significantly interfere with the emission of radiation from the electronic components.

Example 9

Example 9 demonstrates that interboard connections can be made using the design rules. In Example 9, an assembly of an AMLCD or an AMOLED system, more than one controlling board is used to operate the display.

To connect each board to other controlling boards and to the display panel, several ways have been employed for interboard connections. In AMLCDs, it is common to use flexible connections with ACF (Anisotropic Conductive Film) tape. Instead, reflow soldering is used to reduce contact resistance. Since the AMOLED panel draws large current, the power transmission line has a small resistance to reduce the heat generated and the voltage drop along the power transmission line. For a current of 2 A flowing through a conductor that includes copper and has a thickness of approximately 34 microns, at least a width of 0.17 inch is required to guarantee that the temperature rise is lower than 5° C. The voltage drop across such line with length of 6 inches is around 0.15 V. In a typical flex connector, the conductor has a width of 0.01 inch when the conductor includes copper and has a thickness of approximately 34 microns. In one embodiment, a single conductor serving as the power transmission line will not be enough to limit the temperature rise and voltage drop. In one embodiment, several conductors are used. In one specific embodiment, at least 17 conductors are used. In another embodiment, different interboard connectors are used for data lines and selection lines. In still another embodiment, a separate flex connector dedicated solely to the power transmission lines could be employed. In a further embodiment, a separate electric wire could be provided as the power transmission line. In the latter case, the copper wire with low resistance not only reduces the heat generated, but also has negligible voltage drop.

Example 10

Example 10 demonstrates a power transmission line arrangement when more than one type of power transmission line is present. In Example 10, the two types of power transmission lines include $V_{DD}$ and $V_{SS}$. In another embodiment, other or additional power transmission lines could also be designed.

Figure 13:
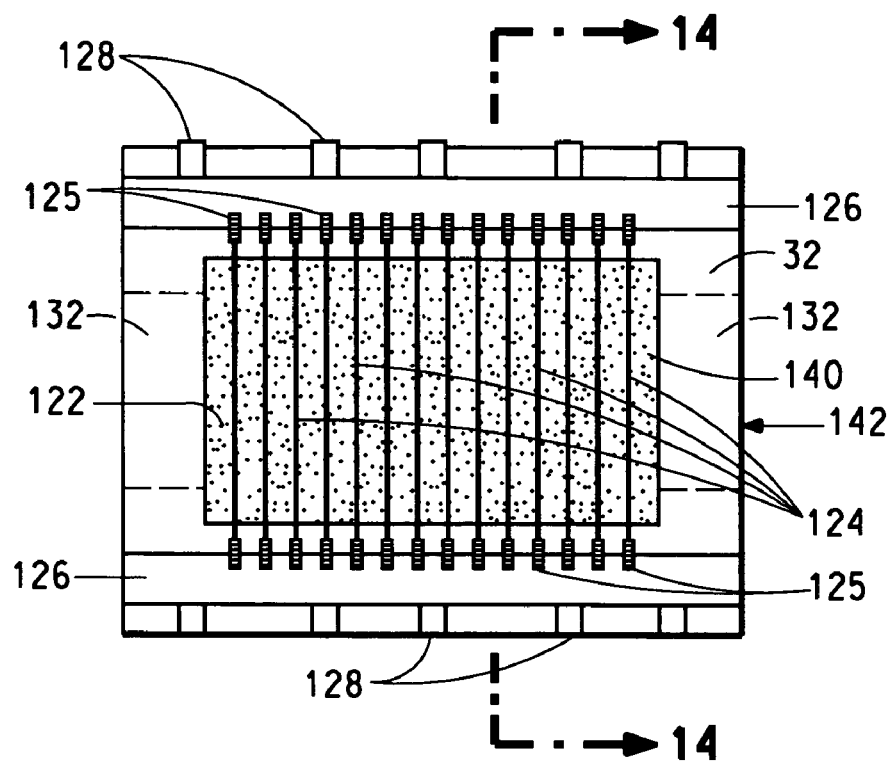
FIGS. 13 and 14 include illustrations of a plan view and a cross-sectional view, respectively, of separate $V_{SS}$ and $V_{DD}$ edge connectors along opposite sides of a back panel in accordance with one embodiment.
Figure 14:
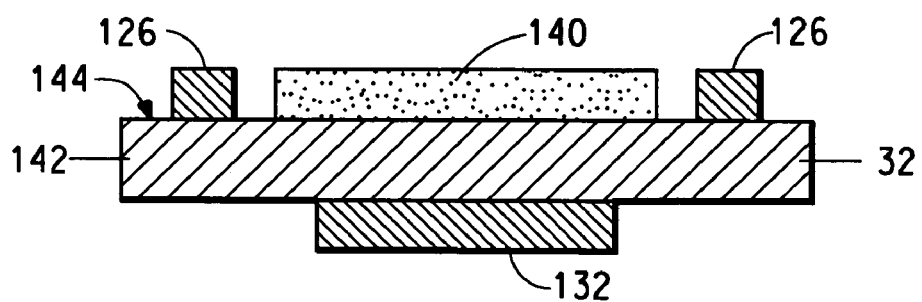

Both $V_{DD}$ and $V_{SS}$ can have power connection lines to transmit sufficient current efficiently to the radiation-emitting electronic components, without significant voltage drop along the power transmission lines and without a significant temperature rise. These power connections ($V_{DD}$ and $V_{SS}$) cannot be connected to each other (an electrical short would result). Special consideration is used in designing the placement of the edge connectors and power transmission lines relative to one another. In one embodiment, the onboard $V_{SS}$ edge connector(s) is placed on one side of the back panel, and the onboard $V_{DD}$ edge connector(s) is placed on the opposite side of the back panel (or the other side without $V_{SS}$ edge connector(s)). One embodiment of the configuration is illustrated in FIGS. 13 and 14. The $V_{SS}$ edge connector 132 lies on one side of back panel 32, and the features of the $V_{DD}$ plane (edge connectors 128, wide power transmission lines 126, and power transmission lines 124) lie on the other side of the back panel 32. In FIG. 14, the $V_{SS}$ connector 132 may lie on a side of the back panel 32 opposite of the array 140, however, in a direction parallel to the primary surface 144, sides of the edge connector 132 lie between the array 140 and a perimeter 142 of the back panel 32.

Figure 15:
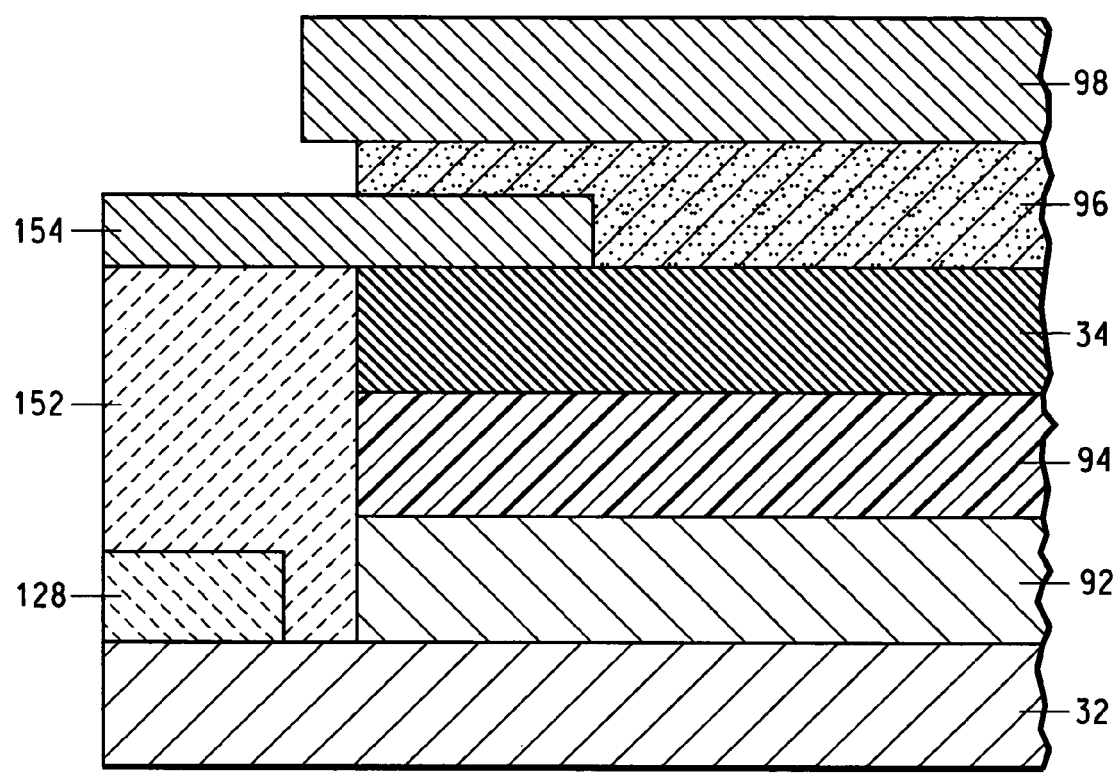
FIG. 15 includes an illustration of a cross-sectional view of a portion of a display including separate $V_{SS}$ and $V_{DD}$ edge connectors along the same side of a back panel in accordance with one embodiment.

In another embodiment as illustrated in FIG. 15, the edge connectors for $V_{DD}$ and $V_{SS}$ may lie on the same side of the back panel 32. More specifically, the $V_{DD}$ edge connector 128 may be deposited over the back panel 32. In one embodiment, the edge connector is electrically connected to the control circuit (not shown) within the back panel, and such control circuit would also be electrically connected to the first electrode 92. The first electrode 92, organic layer 94, and common electrode 34 can be formed using a conventional technique. An electrical insulating layer 152 is placed over the $V_{DD}$ edge connector 128. In one embodiment, the electrical insulating layer 152 may be formed by depositing and patterning the layer using a conventional technique. A portion of the insulating layer 152 can be patterned at a location (not illustrated) to expose a portion of the $V_{DD}$ edge connector 128. The $V_{SS}$ edge connector 154 is deposited over the electrical insulating layer 152 and the common electrode 34. The $V_{SS}$ edge connector 154 is electrically connected to the common electrode in this embodiment. An epoxy layer 96 and an encapsulation cap 98 can be formed over the $V_{SS}$ edge connector 154 and common electrode 34 as previously described in this specification. An advantage of this embodiment is that the $V_{DD}$ edge connector 128, $V_{SS}$ edge connector 154, and the insulating layer 152 form a capacitor that could be used to filter out noise.

In another embodiment, the $V_{SS}$ and $V_{DD}$ edge connectors lie on the same side of the back panel 32, but are laterally offset from each other as seen from a plan view. In this embodiment, air may be an electrical insulator. In yet another embodiment, $V_{SS}$ and $V_{DD}$ edge connectors may be similar to the $V_{SS}$ edge connectors as shown and described in Example 5. In one embodiment, $V_{DD}$ power transmission lines are formed on the back panel 32 through panel processing. By using external $V_{SS}$ edge connectors, there will no electric short between the different types of edge connectors. In an embodiment where $V_{SS}$ power transmission lines are formed on the back panel, the external $V_{DD}$ edge connectors will separate them.

In one embodiment where the panel size is greater than a 20" diagonal, the application of multifunctional electrode may be used (see Example 6 and FIG. 10). By transmitting the large current through the multifunctional electrode directly, the space on the AM back panel (which would be the front panel in the bottom-emission arrangement) could be used for the $V_{DD}$ power lines.

4. Advantages

Many different types of electronic devices can be designed and fabricated to meet many different electrical and thermal requirements, including voltage drops along lines and temperature increases within a display panel. Skilled artisans appreciate the flexibility is determining materials, thicknesses, and widths of conductive members to meet their desires for performance and cost. The concepts herein can be extended to many other electronic devices including PM displays, sensor arrays, photovoltaic cells, and the like. In one embodiment, the design considerations are useful in designing displays including electronic devices having relatively high current requirements, emission intensity requirements, or a combination thereof. For example, such an embodiment may include an AMOLED display, a large PMOLED display, and displays that are used outdoors. The concepts may also be extended to other electronic devices (including in electronic devices), where electrical performance and temperature sensitivity are issues.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. An electronic device comprising:
   a substrate having a primary surface;
   an array lying along the primary surface, wherein the array includes one or more radiation-emitting components, one or more radiation-responsive components, or any combination thereof; and
   a first edge connector, wherein, in a direction parallel to the primary surface, the first edge connector lies between the array and a perimeter of the substrate, wherein:
      the first edge connector is connected to the array and designed to transmit a power signal into the array;
      the electronic device is designed, such that during normal operation, the first edge connector has a temperature difference, due to current flow through the first edge connector, of no more than 10° C.;
      the temperature difference is a first temperature minus a second temperature;
      the first temperature is a temperature of the first edge connector when the first edge connector is at a substantially steady state temperature; and
      the second temperature is a substantially ambient temperature.

2. The electronic device of claim 1, wherein the array comprises pixels, wherein each of the pixels comprises a radiation-emitting component.

3. The electronic device of claim 1, wherein each of the radiation-emitting components comprises an organic active layer.

4. The electronic device of claim 3, wherein an emission homogeneity for the array is at least 75% over a lifetime of the electronic device.

5. The electronic device of claim 4, wherein the lifetime of the electronic device is determined by:
   measuring a first emission intensity of the array or a portion of the array at a first time;
   measuring a second emission intensity of the array or the portion of the array at a second time after the first time; and
   dividing the second emission intensity by the first emission intensity to obtain a quotient, wherein an end of the lifetime occurs when the quotient is less than 0.5.

6. The electronic device of claim 4, wherein each of the radiation-emitting components is an OLED.

7. The electronic device of claim 1, further comprising a second edge connector, wherein each of the first and second edge connectors lies immediately adjacent to the array.

8. The electronic device of claim 1, wherein the first edge connector lies immediately adjacent to the array and to a perimeter of the substrate.

9. An electronic device comprising:
   a substrate having a primary surface;
   an array lying along the primary surface, wherein the array includes one or more radiation-emitting components, one or more radiation-responsive components, or any combination thereof; and
   a first edge connector, wherein, in a direction parallel to the primary surface, the first edge connector lies between the array and a perimeter of the substrate, wherein:
      the first edge connector is connected to the array and designed to transmit a power signal into the array; and
      an emission homogeneity for the array is at least 75% over a lifetime of the electronic device.

10. The electronic device of claim 9, wherein the array comprises pixels, wherein each of the pixels comprises a radiation-emitting component.

11. The electronic device of claim 9, wherein each of the radiation-emitting components comprises an organic active layer.

12. The electronic device of claim 11, wherein each of the radiation-emitting components is an OLED.

13. The electronic device of claim 9, wherein:
   the electronic device is designed, such that during normal operation, the first edge connector has a temperature difference, due to current flow through the first edge connector, of no more than 10° C.;
   the temperature difference is a first temperature minus a second temperature;
   the first temperature is a temperature of the first edge connector when the first edge connector at a substantially steady state temperature; and
   the second temperature is a substantially ambient temperature.

14. The electronic device of claim 9, further comprising a second edge connector, wherein each of the first and second edge connectors lies immediately adjacent to the array.

15. The electronic device of claim 9, wherein the first edge connector lies immediately adjacent to the array and to a perimeter of the substrate.

16. The electronic device of claim 9, wherein the lifetime of the electronic device is determined by:
   measuring a first emission intensity of the array or a portion of the array at a first time;
   measuring a second emission intensity of the array or the portion of the array at a second time after the first time; and
   dividing the second emission intensity by the first emission intensity to obtain a quotient, wherein an end of the lifetime occurs when the quotient is less than 0.5.

17. A method of using an electronic device comprising:
   providing the electronic device comprising:
      a substrate having a primary surface;
      an array lying along the primary surface, wherein the array includes one or more radiation-emitting components, one or more radiation-responsive components, or any combination thereof; and
      a first edge connector, wherein, in a direction parallel to the primary surface, the first edge connector lies between the array and a perimeter of the substrate;
   transmitting a power signal through the first edge connector to the array; and
   operating the electronic device, such that an emission homogeneity for the array is at least 75% during a lifetime of the electronic device.

18. The method of claim 17, wherein the array comprises pixels, wherein each of the pixels comprises a radiation-emitting component.

19. The method of claim 17, wherein each of the radiation-emitting components comprises an organic active layer.

20. The method of claim 17, wherein operating the electronic device comprises operating the electronic device until the first edge connector reaches a substantially steady state temperature, wherein:
the first edge connector experiences a temperature difference, due to current flow through the first edge connector, of no more than 10° C.;
the temperature difference is a first temperature minus a second temperature;
the first temperature is a temperature of the first edge connector when the first edge connector is at a substantially steady state temperature; and
the second temperature is a substantially ambient temperature.

21. The method of claim 17, further comprising a second edge connector, wherein each of the first and second edge connectors lies immediately adjacent to the array.

22. The method of claim 17, wherein the first edge connector lies immediately adjacent to the array and to a perimeter of the substrate.

23. The method of claim 17, wherein the lifetime of the electronic device is determined by:
measuring a first emission intensity of the array or a portion of the array at a first time;
measuring a second emission intensity of the array or the portion of the array at a second time after the first time; and
dividing the second emission intensity by the first emission intensity to obtain a quotient, wherein an end of the lifetime occurs when the quotient is less than 0.5.

* * * * *